(12) United States Patent
Yoo et al.

(10) Patent No.: US 10,410,874 B2
(45) Date of Patent: Sep. 10, 2019

(54) PLASMA PROCESSING APPARATUS AND METHOD, AND METHOD OF MANUFACTURING SEMICONDUCTOR DEVICE USING THE SAME

(71) Applicant: Samsung Electronics Co., Ltd., Suwon-si, Gyeonggi-do (KR)

(72) Inventors: Beom Jin Yoo, Hwaseong-si (KR); Sang Ki Nam, Seongnam-si (KR); Kwang-Youb Heo, Yongin-si (KR); Jehun Woo, Suwon-si (KR); Sang-Heon Lee, Seongnam-si (KR); Masahiko Tomita, Seongnam-si (KR); Vasily Pashkovskiy, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/867,082

(22) Filed: Jan. 10, 2018

(65) Prior Publication Data

US 2019/0035606 A1 Jan. 31, 2019

(30) Foreign Application Priority Data

Jul. 25, 2017 (KR) .......................... 10-2017-0094335

(51) Int. Cl.
| | |
|---|---|
| *H01L 21/3065* | (2006.01) |
| *H01J 37/32* | (2006.01) |
| *H01L 21/027* | (2006.01) |
| *H01L 21/67* | (2006.01) |
| *H01L 21/683* | (2006.01) |
| *H01L 21/311* | (2006.01) |

(52) U.S. Cl.
CPC .... *H01L 21/3065* (2013.01); *H01J 37/32128* (2013.01); *H01J 37/32146* (2013.01); *H01J 37/32165* (2013.01); *H01J 37/32174* (2013.01); *H01J 37/32724* (2013.01); *H01L 21/0273* (2013.01); *H01L 21/31116* (2013.01); *H01L 21/31138* (2013.01); *H01L 21/31144* (2013.01); *H01L 21/67069* (2013.01); *H01L 21/67248* (2013.01); *H01L 21/6831* (2013.01); *H01L 21/6833* (2013.01); *H01J 2237/334* (2013.01); *H01L 21/67103* (2013.01); *H01L 21/67109* (2013.01)

(58) Field of Classification Search
None
See application file for complete search history.

(56) References Cited

U.S. PATENT DOCUMENTS

| | | | |
|---|---|---|---|
| 7,169,255 B2 | 1/2007 | Yasui et al. | |
| 7,521,362 B2 | 4/2009 | Takeshita et al. | |
| (Continued) | | | |

FOREIGN PATENT DOCUMENTS

KR   10-1047318   7/2011

*Primary Examiner* — Jiong-Ping Lu
(74) *Attorney, Agent, or Firm* — Sughrue Mion, PLLC

(57) ABSTRACT

In a plasma processing method, a substrate is loaded onto a substrate electrode within a chamber, the substrate having an object layer to be etched thereon. A plasma generating power output is applied to form plasma within the chamber. A first bias power output is applied to the substrate electrode to perform a first etch stage on the object layer. A second bias power output having a nonsinusoidal voltage waveform is applied to the substrate electrode to perform a second etch stage on the object layer.

7 Claims, 7 Drawing Sheets

(56) References Cited

U.S. PATENT DOCUMENTS

| | | |
|---|---|---|
| 7,615,132 B2 | 11/2009 | Yasui et al. |
| 8,968,838 B2 | 3/2015 | Booth et al. |
| 9,117,767 B2 | 8/2015 | Marakhatanov et al. |
| 9,287,086 B2 | 3/2016 | Brouk et al. |
| 9,287,092 B2 | 3/2016 | Brouk et al. |
| 2002/0125207 A1* | 9/2002 | Ono .................. C23F 4/00 216/2 |
| 2003/0170986 A1* | 9/2003 | Nallan ............. H01L 21/31116 438/689 |
| 2011/0259851 A1* | 10/2011 | Brouk ................. C23C 14/345 216/61 |
| 2015/0325413 A1* | 11/2015 | Kim ................. H01J 37/32715 315/111.21 |

* cited by examiner

PLASMA PROCESSING APPARATUS AND METHOD, AND METHOD OF MANUFACTURING SEMICONDUCTOR DEVICE USING THE SAME

CROSS-REFERENCE TO RELATED APPLICATION

This application claims priority under 35 U.S.C. § 119 to Korean Patent Application No. 10-2017-0094335, filed on Jul. 25, 2017 in the Korean Intellectual Property Office (KIPO), the contents of which are herein incorporated by reference in their entirety.

FIELD

Example embodiments relate to plasma processing apparatus and method, and a method of manufacturing a semiconductor device using the same. More particularly, example embodiments relate to plasma processing apparatus and method of etching a layer formed on a substrate using plasma, and a method of manufacturing a semiconductor device using the same.

BACKGROUND

Many types of semiconductor devices may be manufactured using plasma-based etching techniques. For example, a plasma etching apparatus such as an inductively coupled plasma etching apparatus, a capacitively coupled plasma etching apparatus, a microwave plasma etching apparatus, etc., may generate plasma within a chamber to perform an etching process. However, new processes and techniques for minimizing damage to an underlying layer due to pattern miniaturization and controlling an etch profile may be required.

SUMMARY

Example embodiments provide a plasma processing method of capable of minimizing damage due to an etching process and improving controllability of an etch profile.

Example embodiments provide a method of manufacturing a semiconductor device using the plasma processing method.

Example embodiments provide a plasma processing apparatus for performing the plasma processing method.

According to example embodiments, in a plasma processing method, a plasma generating power output is applied to form plasma within the chamber. A first bias power output is applied to the substrate electrode within a chamber to perform a first etch stage on an object layer on the substrate within the chamber. A second bias power output having a nonsinusoidal voltage waveform is applied to the substrate electrode to perform a second etch stage on the object layer on the substrate.

According to example embodiments, in a method of manufacturing a semiconductor device, a plasma generating power output is applied to form plasma within a chamber. A first bias power output is applied to a substrate electrode within the chamber and an object layer on a semiconductor substrate within the chamber is etched until an underlying buffer portion of the object layer remains, to form a preliminary pattern in the object layer. A second bias power output having a nonsinusoidal voltage waveform is applied to the substrate electrode and the preliminary pattern in the object layer is etched to remove the underlying buffer portion of the object layer and form an object layer pattern.

According to example embodiments, a plasma processing apparatus includes a chamber providing a space to process a substrate, a substrate stage configured to support the substrate within the chamber, the substrate stage including a substrate electrode, an upper electrode arranged on an upper portion of the chamber to face the substrate electrode, a plasma generating power supply configured to apply a plasma generating power output to the upper electrode in response to a plasma generating power control signal to form plasma within the chamber, a bias power supply configured to selectively apply a first bias power output and a second bias power output to the substrate electrode in response to a bias power control signal, the second bias power output having a nonsinusoidal voltage waveform, a controller configured to control application of the first bias and the second bias power outputs by supplying a bias power control signal corresponding to one of the first and the second bias power outputs to the bias power supply.

According to example embodiments, a first bias power output may be applied to a substrate electrode to perform a first plasma etching process using first ion energy on an object layer, and a second bias power output having a nonsinusoidal voltage waveform may be applied to the substrate electrode to perform a second plasma etching process using second ion energy less than the first ion energy on the object layer.

Thus, the bias power output applied to the substrate electrode may be adjusted to control the amount and diffusion width of ion energy generated on the object layer, to thereby minimize damage to an underlying layer of the object layer and to obtain an improved etch profile.

BRIEF DESCRIPTION OF THE DRAWINGS

Example embodiments will be more clearly understood from the following detailed description taken in conjunction with the accompanying drawings.

FIG. 1 is a block diagram illustrating a plasma processing apparatus in accordance with example embodiments.

FIG. 2 is a waveform diagram illustrating a first bias power output generated by a first bias power supply of the plasma processing apparatus in FIG. 1.

FIG. 3 is a waveform diagram illustrating a second bias power output generated by a second bias power supply of the plasma processing apparatus in FIG. 1.

FIG. 4 is graphs illustrating ion energy distribution on a substrate surface generated by the second bias power output in FIG. 3.

FIG. 5 is a graph illustrating a temperature of an electrostatic chuck controlled during a plasma process by a temperature controller of the plasma processing apparatus in FIG. 1.

FIG. 6 is a flow chart illustrating a plasma processing method in accordance with example embodiments.

FIGS. 7 to 9 are cross-sectional views illustrating a method of forming a pattern of a semiconductor device in accordance with example embodiments.

DETAILED DESCRIPTION OF EXAMPLE EMBODIMENTS

Figure 1:
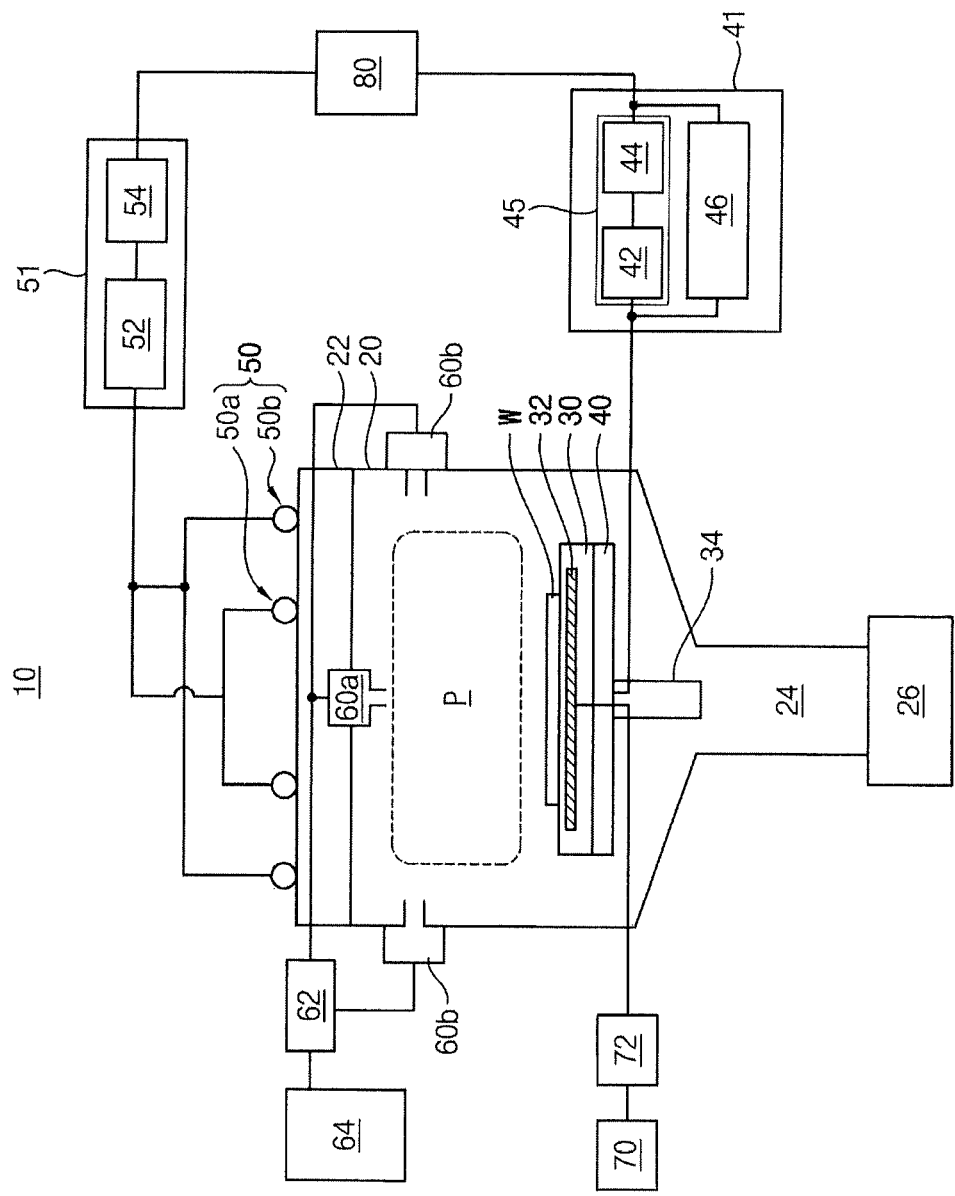
FIGS. 1 to 9 represent non-limiting, example embodiments as described herein.
Figure 2:
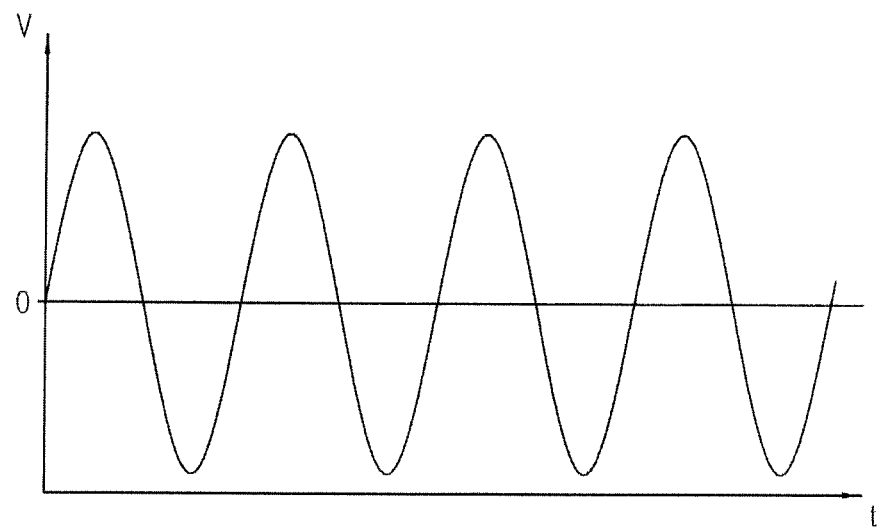
Figure 3:
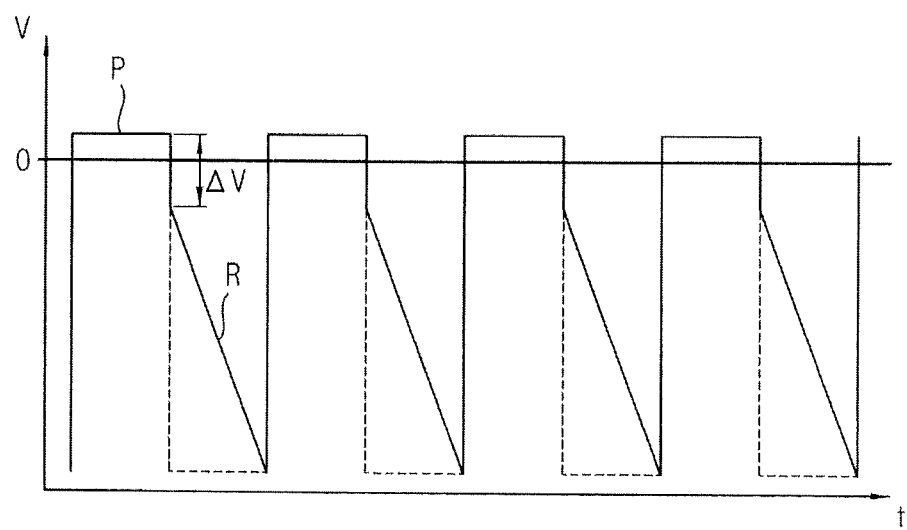
Figure 4:
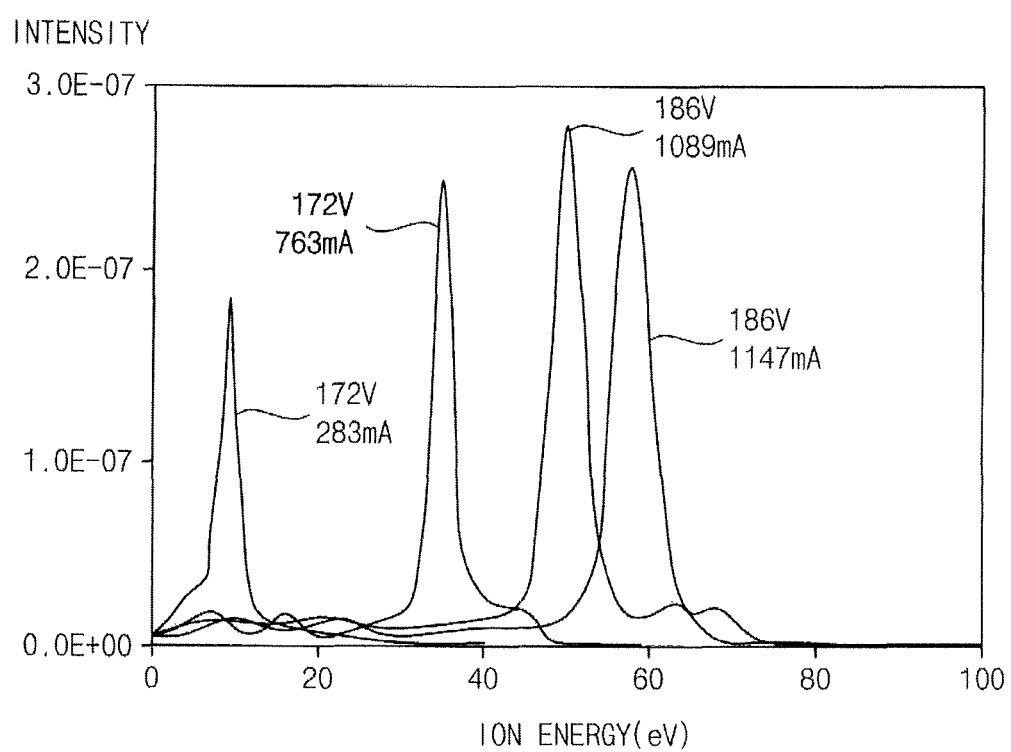
Figure 5:
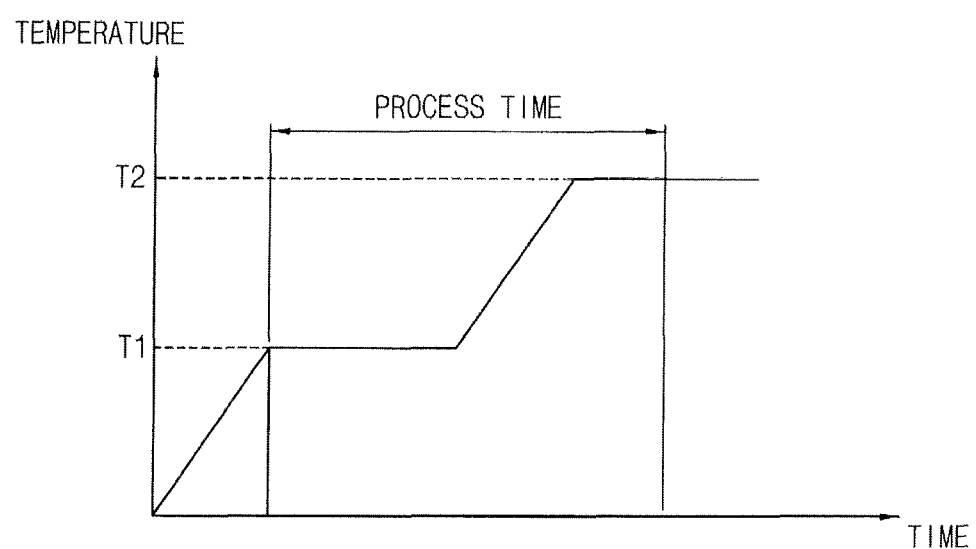

FIG. 1 is a block diagram illustrating a plasma processing apparatus in accordance with example embodiments. FIG. 2 is a waveform diagram illustrating a first bias power output generated by a first bias power supply of the plasma processing apparatus in FIG. 1. FIG. 3 is a waveform diagram illustrating a second bias power output generated by a second bias power supply of the plasma processing apparatus in FIG. 1. FIG. 4 is graphs illustrating ion energy distribution on a substrate surface generated by the second bias power output in FIG. 3. FIG. 5 is a graph illustrating the temperature of an electrostatic chuck controlled during a plasma process by a temperature controller of the plasma processing apparatus in FIG. 1.

Referring to FIGS. 1 to 5, a plasma processing apparatus 10 may include a chamber 20, a substrate stage having a substrate electrode 40, an upper electrode 50, a plasma generating power supply 51, a bias power supply 41 and a controller 80.

In example embodiments, the plasma processing apparatus 10 may be an apparatus configured to etch a layer on a substrate such as a wafer W disposed within the chamber 20 with, for example, inductively coupled plasma (ICP), generated within the chamber 20. However, the plasma generated by the plasma processing apparatus is not particularly limited to inductively coupled plasma. For example, capacitively coupled plasma, microwave plasma, etc., may be generated by the plasma processing apparatus. Additionally, the plasma processing apparatus is not particularly limited to an etching apparatus. For example, the plasma processing apparatus may be used as a deposition apparatus, a cleaning apparatus, etc. The substrate processed by the plasma processing apparatus 10 include, but are not particularly limited to, a semiconductor substrate, a glass substrate, etc.

The chamber 20 may provide a sealed space where a plasma etching process is performed on the wafer W. The chamber 20 may be a cylindrical shaped vacuum chamber. The chamber 20 may include a metal such as aluminum, stainless steel, etc.

The substrate stage may be arranged within the chamber 20 to support the substrate. For example, the substrate stage may serve as a susceptor for supporting the wafer W thereon. The substrate stage may include an electrostatic chuck 30 for holding the wafer W using electrostatic force. The wafer W may be adsorptively held on the electrostatic chuck 30 when a direct current is applied thereto by a DC power source (not illustrated).

Additionally, the substrate stage may include the circular plate-shaped substrate electrode 40 under the electrostatic chuck 30. The substrate electrode 40 may be supported by a support member 34 such that the substrate electrode 40 may move upward and downward.

The wafer W may be mounted on an upper surface of the electrostatic chuck 30, and a focus ring (not illustrated) may be installed on the substrate stage to surround the wafer W. The substrate electrode 40 may have a diameter greater than a diameter of the wafer W. The substrate electrode 40 may have a cooling channel (not illustrated) therein. In order to increase and control accuracy of wafer temperature, a heat transfer gas, such as He gas, may be supplied to a gap between the electrostatic chuck and the wafer W.

A gate (not illustrated) for opening and closing a loading/unloading port for the wafer W may be provided in a sidewall of the chamber 20. The wafer W may be loaded/unloaded onto/from the substrate stage through the gate.

A gas exhaust port 24 may be provided in a bottom portion of the chamber 20. A gas exhaust unit 26 may be connected to the gas exhaust port 24 through a gas exhaust line. The gas exhaust unit may include a vacuum pump such as a turbo-molecular pump or the like, to control a pressure of the chamber 20 so that the processing space inside the chamber 20 may be depressurized to a desired vacuum level. Additionally, process by-products and residual process gases may be discharged through the gas exhaust port 24.

The chamber 20 may include a cover 22 covering an upper portion of the chamber 20. The cover 22 may form an airtight seal with the upper portion of the chamber 20. The upper electrode 50 may be disposed outside the chamber 20 such that the upper electrode 50 faces the substrate electrode 40. The upper electrode 50 may be disposed on the cover 22. The upper electrode 50 may include a radio frequency antenna. The radio frequency antenna may have a plan coil shape. The cover 22 may include a circular plate shaped dielectric window. The dielectric window may include a dielectric material. For example, the dielectric window may include alumina ($Al_2O_3$). The power from the antenna may be transferred into the chamber through the dielectric window.

For example, the upper electrode 50 may include an inner coil 50a and an outer coil 50b. The inner coil 50a and the outer coil 50b may have a spiral shape or a concentric shape. The inner coil 50a and the outer coil 50b may generate inductively coupled plasma in a space P of the chamber 20. Herein, two coils are described exemplarily, however, it is understood that the number, arrangement, etc. of the coils is not particularly limited thereto.

In example embodiments, the plasma processing apparatus 10 may further include a gas supply unit for supplying a gas into the chamber 20. For example, the gas supply unit may include gas supply lines 60a, 60b, a flow controller 62 and a gas supply source 64, such as gas supply elements. The gas supply lines may be connected to the upper portion and/or the side portion of the chamber 20 to supply the gases into the chamber 20 therethrough. For example, the gas supply lines may include a vertical gas supply line 60a which penetrates through the cover 22 and a horizontal gas supply line 60b which penetrates through the sidewall of the chamber 20. Various gases may be supplied into the space P of the chamber 20 through the vertical gas supply line 60a and the horizontal gas supply line 60b.

The gas supply unit may supply different gases having a desired mixture ratio. The gas supply source 64 may store a plurality of the gases, and the gases may be supplied through a plurality of gas lines connected to the gas supply lines 60a, 60b respectively. The flow controller 62 may control an amount of the gases supplied into the chamber 20 through the gas supply lines 60a, 60b. The flow controller 62 may control independently or commonly the supply amounts of the gases supplied to the vertical gas supply line 60a and the horizontal gas supply line 60b respectively. For example, the gas supply source 64 may include a plurality of gas tanks, and the flow controller 62 may include a plurality of mass flow controllers (MFCs) corresponding to the gas tanks. The mass flow controllers may control independently the supply amounts of the gases respectively.

The gas supply unit may supply different process gases into the chamber 20. The process gases may include inert gases.

For example, the gas supply unit may supply a mixture gas of hydrogen gas ($H_2$ gas) and nitrogen gas ($N_2$ gas). A mixture ratio of the hydrogen gas ($H_2$ gas) and the nitrogen gas ($N_2$ gas) may be controlled, to thereby obtain an improved etch profile (for example, an angle between a bottom face and a sidewall face of an etched portion).

The plasma generating power supply 51 may apply a plasma source power output to the upper electrode 50. For example, the plasma power supply may include a source RF power source 54 and a source RF matcher 52, such as plasma source elements. The source RF power source 54 may generate a radio frequency (RF) signal. The source RF matcher 52 may match impedance of the RF signal generated by the source RF power source using the coils 50a, 50b to control generation of plasma.

The bias power supply 41 may apply a bias source power output to the substrate electrode 40. In particular, the bias power supply 41 may include a first bias power supply 45 configured to apply a first bias source power output to the substrate electrode 40 and a second bias power supply 46 configured to apply a second bias source power output to the substrate electrode 40.

The first bias power supply 45 may include a bias RF power source 44 and a bias RF matcher 42, such as bias elements. The substrate electrode 40 may attract plasma atoms or ions generated within the chamber 20. The bias RF power source 44 may generate a radio frequency (RF) signal. The bias RF matcher 42 may match impedance of the bias RF signal by controlling bias voltage and bias current applied to the substrate electrode 40. The bias RF power source 44 and the source RF power source 54 may be synchronized or desynchronized each other through a synchronizer of the controller 80.

The controller 80 may be connected to the plasma generating power supply 51 and the bias power supply 41 and control operations thereof. The controller 80 having a microcomputer and various interface circuits may control an operation of the plasma processing apparatus based on programs and recipe information stored in an external or internal memory.

In particular, the controller 80 may generate a plasma generating power control signal and a bias power control signal. The plasma generating power supply 51 may apply a plasma source power output to the upper electrode 50 in response to the plasma generating power control signal. The bias power supply 41 may apply a bias source power output to the substrate electrode 40 in response to the bias source power control signal.

The plasma generating power supply 51 may apply an RF power output to the upper electrode 50 in response to the plasma generating power control signal. For example, the RF power output may be generated to have a frequency range of about 27 MHz to about 2.45 GHz and a RF power range of about 100 W to about 1000 W. For example, the radio frequency power may be generated to have a frequency of about a 40 MHz to about 1.5 GHz.

As the RF power output having a predetermined frequency (for example, 13.56 MHz) is applied to the upper electrode 50, an electromagnetic field induced by the upper electrode 50 may be applied to a source gas supplied within the chamber 20 to generate plasma.

In example embodiments, the controller 80 may generate a first bias power control signal when a first etch stage using a relatively high ion energy is to be performed, and the first bias power supply 45 of the bias power supply 41 may apply a first bias power output to the substrate electrode 40 in response to the first bias power control signal. The controller 80 may generate a second bias power control signal when a second etch stage using a relatively low ion energy is to be performed, and the second bias power supply 46 of the bias power supply 41 may apply a second bias power output to the substrate electrode 40 in response to the second bias power control signal.

As illustrated in FIGS. 2 and 3, the first bias power output may have a sinusoidal voltage waveform, and the second bias power output may have a nonsinusoidal voltage waveform. Alternatively, the first bias power output and the second bias power output may have a nonsinusoidal voltage waveform. The second bias power output may have an arbitrary waveform, but not a sinusoidal waveform.

The first bias power supply 45 may include an RF power source and may apply an RF power output having a desired sinusoidal voltage waveform to the substrate electrode 40. The second bias power supply 46 may include various circuits which are configured to generate a bias power output having a nonsinusoidal voltage waveform and supply a compensation current, and can apply a bias power output having a desired nonsinusoidal voltage waveform to the substrate electrode 40.

The voltage waveform of the bias power output applied by the bias power supply 41 may be controlled such that a desired ion energy distribution may be generated in a surface of a wafer W. The bias power output applied by the first and second bias power supplies may be controlled to adjust ion energy without substantially affecting plasma density.

For example, when a first bias power output having a sinusoidal voltage waveform of a predetermined frequency (for example, 13.56 MHz) is applied to the substrate electrode 40, an ion energy distribution having two peak values may be generated in the surface of the wafer W. On the other hand, when a second bias power output having a nonsinusoidal voltage waveform is applied to the substrate electrode 40, an ion energy distribution having one peak value may be generated on the surface of the wafer W.

As illustrated in FIG. 3, the second bias power output may have a DC pulse portion (P) and a ramp portion (R). The ramp portion (R) may be a portion which is modulated by the compensation current, and may have a waveform which declines gradually over time while decreasing from the maximum of the DC pulse portion (P) to the minimum of the DC pulse portion (P), that is, a negative slope.

As illustrated in FIG. 4, a desired distribution of ion energy may be generated on a substrate surface may be formed as a result of the second bias power output. For example, the voltage value of the second bias power output and the compensation current may be controlled to form ion energy having a different amount and distribution on the substrate surface.

The voltage value of the bias power output and the compensation current may be adjusted to control the amount and diffusion width of ion energy generated, to thereby minimize damage to an underlying layer of an object layer to be etched and improving an etch profile.

For example, in the first etch stage, the first bias power supply 45 may apply a first bias power output having a sinusoidal voltage waveform to the substrate electrode 40 to form a first ion energy on a surface of a wafer W. In the second etch stage, the second bias power supply 46 may apply a second bias power output having a nonsinusoidal voltage waveform to the substrate electrode 40 to form a second ion energy on the surface of the wafer W that is less than the first ion energy.

In example embodiments, the plasma processing apparatus 10 may include a temperature control device within the substrate stage. The temperature control device may include a heater and/or a cooler. For example, the temperature control device may include a heater 32 within the electrostatic chuck 30 to control a temperature of the electrostatic chuck 30, a heater power supply 70 configured to supply a power to the heater 32, and a filter 72 disposed between the heater 32 and the heater power supply 70.

The heater power supply 70 may be electrically connected to the heater 32 via an ON-OFF switch through a wire. When the switch is turned ON, an AC power output of a sinusoidal waveform from the heater power supply 70 may be applied to the heater 32. However, the bias power output from the bias power supply 41 may be transferred to the heater power supply 70 through the wire, causing damage to the heater power supply 70. Accordingly, the filter 72 may pass the AC component of the sinusoidal waveform from the heater power supply 70 and may block a pulse component from the bias power supply 41, to thereby protect the heater power supply 70. For example, the filter 72 may pass a low frequency range including 60 Hz and may block a high frequency range including 400 kHz. The filter 72 may include a lower pass filter circuit having an inductor, a capacitor or a resistance.

As illustrated in FIG. 5, the temperature control device may use the heater power supply 70 to adjust the power applied to the heater 32, to thereby control the temperature of the electrostatic chuck 30. During a first period of a total process time of an etching process, the temperature of the electrostatic chuck 30 may be determined as a first preset temperature T1. During the first period, the electrostatic chuck 30 may be heated to the first preset temperature T1. During a second period of the etching process, the temperature of the electrostatic chuck 30 may be increased from the first preset temperature to a second preset temperature T2. During the etching process, the temperature of the electrostatic chuck 30 may be controlled to be increased or decreased gradually. The wafer W may be processed at the first preset temperature during the first period of the etching process and may be processed at the second preset temperature during the second period of the etching process.

Hereinafter, a method of processing a substrate using the plasma processing apparatus in FIG. 1 will be explained.

Figure 6:
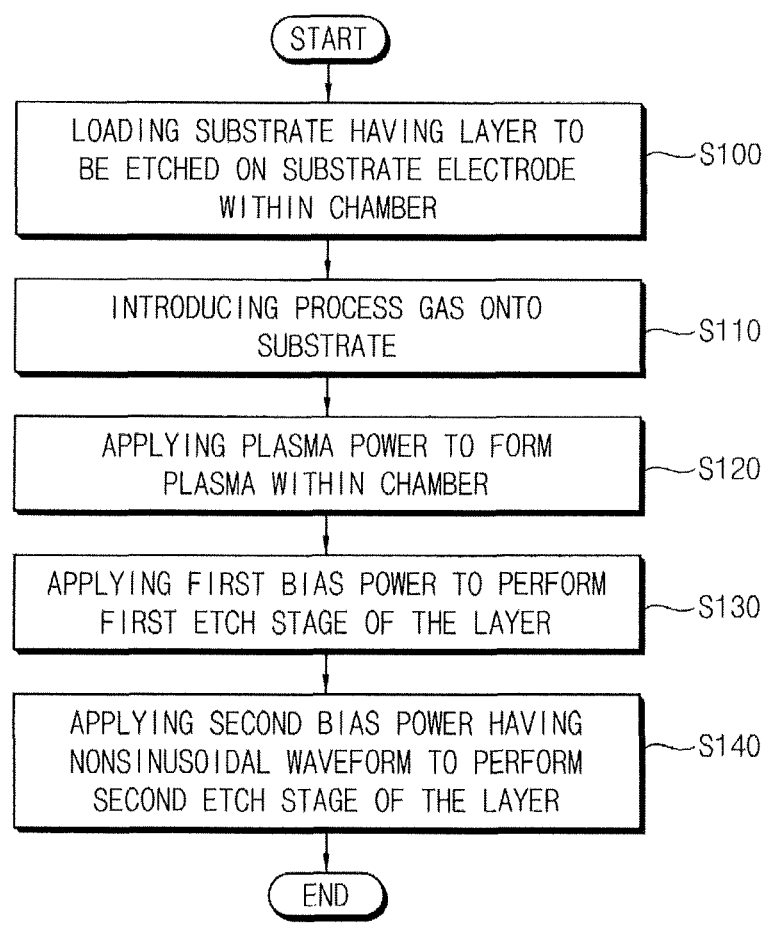

FIG. 6 is a flow chart illustrating a plasma processing method in accordance with example embodiments.

Referring to FIGS. 1 and 6, after a substrate is loaded into a chamber 20 such as, for example, an inductively coupled plasma chamber (S100), a process gas may be supplied onto the substrate (S110).

First, a semiconductor wafer W may be loaded on an electrostatic chuck 30 of a substrate stage within the chamber 20. The process gas (for example, an etching gas) may be introduced into the chamber 20 through gas supply lines 60a, 60b and then a pressure of the chamber 20 may be controlled to a desired vacuum level by a gas exhaust unit 26. Different etching gases may be supplied to the chamber 20 through the gas supply lines 60a, 60b. A mixture gas of hydrogen gas (H$_2$ gas) and nitrogen gas (N$_2$ gas) having a predetermined mixture ratio may be supplied to the chamber 20. For example, the percentage of the hydrogen gas (H$_2$ gas) of the total mixture gas may range from zero to 100%, for example, 20%, 40%, 60%, 80%.

In example embodiments, the wafer W may be heated to a preset temperature on the electrostatic chuck 30. An AC power output of a sinusoidal waveform from a heater power supply 70 may be applied to a heater 32 through a wire. A filter 72 may be disposed between the heater 32 and the heater power supply 70. The filter 72 may pass an AC component of a sinusoidal waveform from the heater power supply 70 and may block a pulse component from a bias power supply 41. Thus, the pulse component from a second bias power supply 46 may be blocked to thereby protect the heater power supply 70.

Then, a plasma power may be applied to an upper electrode 50 to generate plasma within the chamber 20 (S120), a first bias power output may be applied to a substrate electrode 40 to perform a first etch stage (S130), and then, a second bias power output may be applied to the substrate electrode 40 to perform a second etch stage (S140).

A plasma generating power supply 51 may apply a radio frequency power output to the upper electrode 50 in response to a plasma power control signal. For example, as the radio frequency power having a predetermined frequency (for example, 13.56 MHz) is applied to the upper electrode 50, an electromagnetic field induced by the upper electrode 50 may be applied to a source gas within the chamber 20 to generate plasma.

A first bias power supply 45 of the bias power supply 41 may apply a first bias power output to the substrate electrode 40 in response to a first bias power control signal, to perform a main etching process (a first etch stage) of an object layer to be etched on the wafer W.

The first bias power output may have a sinusoidal voltage waveform. Alternatively, the first bias power output may have a nonsinusoidal voltage waveform. When a first bias power output having a sinusoidal voltage waveform of a predetermined frequency (for example, 13.56 MHz) or having a nonsinusoidal voltage waveform of a predetermined frequency (for example, 400 kHz) is applied to the substrate electrode 40, relatively high ion energy may be generated in the surface of the wafer W. The ion energy may have one or two peak values. Accordingly, the first etch stage may be performed at a relatively high speed using relatively high ion energy.

A portion of the object layer exposed by a photoresist mask may be removed by the first etch stage, to form a first opening having a first depth in the object layer.

In example embodiments, during a first period of the first etch stage, the electrostatic chuck 30 may be heated to a first preset temperature. During a second period of the first etch stage, the temperature of the electrostatic chuck 30 may be increased from the first preset temperature to a second preset temperature. The wafer W may be processed at the first preset temperature during the first period of the first etch stage and may be processed at the second preset temperature during the second period of the first etch stage.

A second bias power supply 46 of the bias power supply 41 may apply a second bias power output to the substrate electrode 40 in response to a second bias power control signal of a controller 80, to perform an over etching process (a second etch stage) of the object layer on the wafer W.

The second bias power output may have a nonsinusoidal voltage waveform. As illustrated in FIG. 3, the second bias power output may have a DC pulse portion (P) and a ramp portion (R). The ramp portion (R) may be a portion which is modulated by a compensation current applied to the substrate electrode 40, and may have a waveform which declines gradually over time while decreasing from the maximum of the DC pulse portion (P) to the minimum of the DC pulse portion (P).

When a second bias power output having the nonsinusoidal voltage waveform is applied to the substrate electrode 40, relatively low ion energy (about 100 eV) may be generated on the surface of the wafer W. The ion energy may have one peak value. Accordingly, the second etch stage may be performed at a relatively low speed using relatively low ion energy.

A portion of the object layer on which the first etch stage has been performed may be further removed by the second etch stage, to form a second opening having a second depth greater than the first depth.

In example embodiments, during a third period of the second etch stage, the electrostatic chuck 30 may be heated to a third preset temperature. During a fourth period of the second etch stage, the temperature of the electrostatic chuck 30 may be increased from the third preset temperature to a fourth preset temperature. The wafer W may be processed at the third preset temperature during the third period of the second etch stage and may be processed at the fourth preset temperature during the fourth period of the second etch stage.

As mentioned above, a voltage value of the bias power output and the compensation current applied to the substrate electrode may be adjusted to control the amount and diffusion width of ion energy generated on the object layer, to thereby minimize damage to an underlying layer and to thereby obtain an improved etch profile.

Hereinafter, a method of forming a pattern of a semiconductor device using the plasma processing apparatus will be explained.

Figure 7:
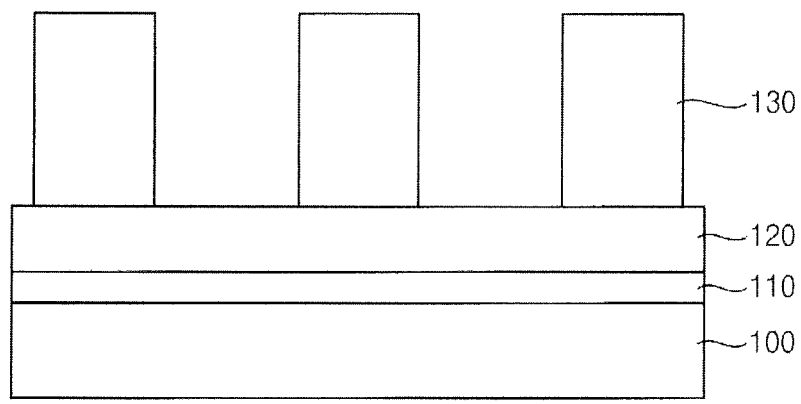
Figure 8:
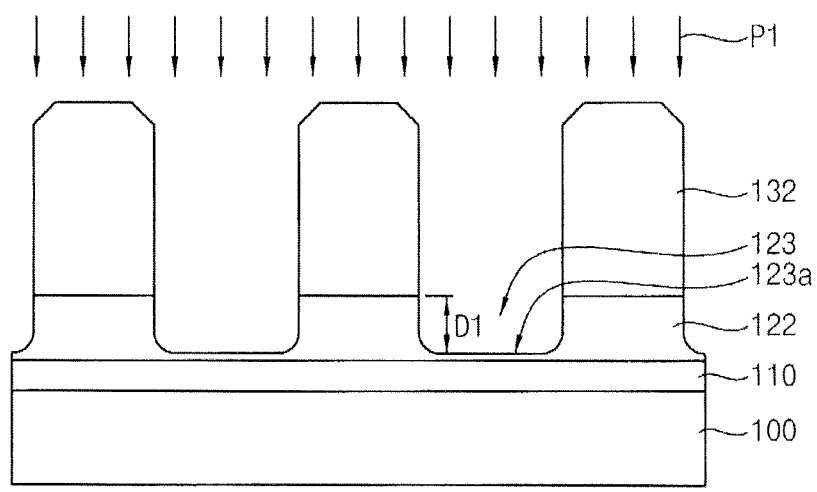
Figure 9:
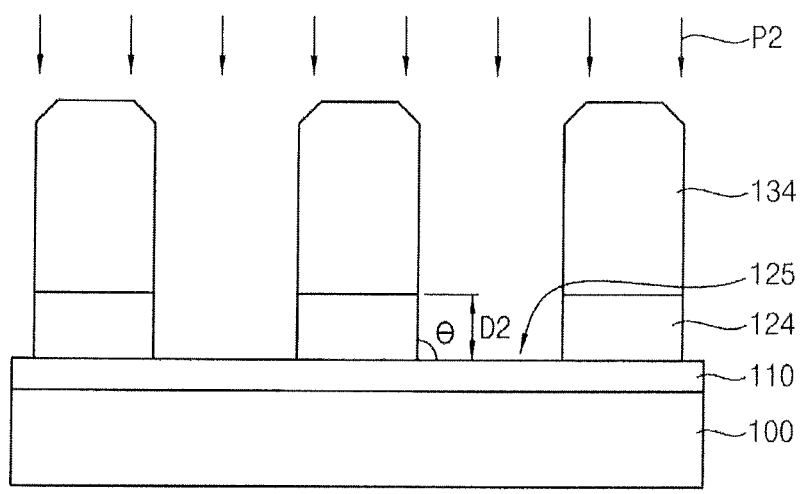

FIGS. 7 to 9 are cross-sectional views illustrating a method of forming a pattern of a semiconductor device in accordance with example embodiments.

Referring to FIG. 7, first, a photoresist pattern may be formed on an object layer 120 to be etched. The object layer 120 may be or may include an organic layer formed on a substrate 100, such as, for example, a semiconductor substrate. Alternatively, the object layer may be the substrate 100. Hereinafter, the object layer will be explained.

In example embodiments, after a thin layer 110 and the object layer 120 are sequentially formed on the substrate 100, the photoresist pattern 130 may be formed on the object layer 120.

The thin layer 110 may include a metal layer, a metal nitride layer, an insulation layer, a semiconductor layer, etc. For example, the thin layer 110 may include a nitride layer, a silicon nitride layer, a silicon layer, a polysilicon layer, a silicon oxide layer, etc. Alternatively, the thin layer 110 may include a titanium nitride layer, a titanium layer, a tungsten layer, a tungsten nitride layer, etc.

The object layer 120 may include an organic layer having an excellent gap filling property. For example, the object layer 120 may include a bottom anti-reflective coating (BARC) layer, a spin on hard mask (SOH) layer, an amorphous carbon layer (ACL), etc. The object layer may be formed by a spin on coating process.

After the photoresist layer is formed on the object layer 120, the photoresist layer may be exposed to form a photoresist pattern 130.

After an exposure mask having a desired pattern is aligned over the photoresist layer, a light may be irradiated onto the exposure mask and a portion of the photoresist layer may be react with a light from the exposure mask. Examples of the light used for the exposure process may be KrF, ArF, EUV (Extreme Ultra Violet), VUV, E-beam, X-ray, an ion beam, etc.

The exposed portion of the photoresist layer may be dissolved by a developer and removed to form the photoresist pattern 130. For example, the photoresist pattern 130 may have a line and space shape having a relatively small line width.

Referring to FIGS. 8 and 9, a first etching process (P1) and a second etching process (P2) may be sequentially performed using the photoresist pattern 130 as an etching mask on the object layer 120.

First, the substrate 100 having the photoresist pattern 130 formed thereon may be loaded into a chamber 20 of a plasma processing apparatus in FIG. 1, a process gas may be supplied onto the substrate 100.

The process gas (for example, an etching gas) may be introduced into the chamber 20 through gas supply lines 60a, 60b and then a pressure of the chamber 20 may be controlled to a desired vacuum level by a gas exhaust unit 26. For example, the pressure of the chamber 20 may be maintained to about 125 mTorr.

Different etching gases may be supplied to the chamber 20 through the gas supply lines 60a, 60b. A mixture gas of hydrogen gas ($H_2$ gas) and nitrogen gas ($N_2$ gas) having a predetermined mixture ratio may be supplied to the chamber 20. For example, the percentage of the hydrogen gas ($H_2$ gas) of the total mixture gas may range from zero to 100%, for example, 20%, 40%, 60%, 80%.

Then, a first etching process using relatively high ion energy may be performed.

A plasma generating power output may be applied to an upper electrode 50 to generate plasma within the chamber 20, and a first bias power output may be applied to a substrate electrode 40 to perform the first etching process.

For example, as a radio frequency power output having a predetermined frequency (for example, 13.56 MHz) is applied to the upper electrode 50, an electromagnetic field induced by the upper electrode 50 may be applied to a source gas within the chamber 20 to generate plasma.

The first bias power output may have a sinusoidal voltage waveform. Alternatively, the first bias power output may have a nonsinusoidal voltage waveform.

For example, a first bias power output having a sinusoidal voltage waveform of a predetermined frequency (for example, 13.56 MHz) is applied to the substrate electrode 40, to generate relatively high ion energy on a surface of the substrate 100.

As illustrated in FIG. 8, the first etching process may be performed at a relatively high etch rate until an underlying buffer portion 123a of the object layer remains, to form a preliminary pattern 122 in the object layer. A portion of the object layer 120 exposed by the photoresist pattern 130 may be removed by the first etching process, to form a first opening 123 having a first depth D1 in the object layer 120.

In example embodiments, the substrate 100 on an electrostatic chuck 30 may be heated to a preset temperature. A power output to a heater 32 may be adjusted using a heater power supply 70, to control the temperature of the electrostatic chuck 30.

During a first period of the first etching process, the electrostatic chuck 30 may be heated to a first preset temperature. During a second period of the first etching process, the temperature of the electrostatic chuck 30 may be increased from the first preset temperature to a second preset temperature. The substrate 100 may be processed at the first preset temperature during the first period of the first etching process and may be processed at the second preset temperature during the second period of the first etching process.

In this case, a filter 72 may be installed between the heater 32 and the heater power supply 70, to pass an AC component of a sinusoidal waveform from the heater power supply 70 and to block a pulse component from the bias power supply 41, to thereby protect the heater power supply 70.

Then, a second etching process using relatively low ion energy may be performed.

A second bias power output may be applied to the substrate electrode 40 to perform the second etching process.

The second bias power output may have a nonsinusoidal voltage waveform. As illustrated in FIG. 3, the second bias power output may have a DC pulse portion (P) and a ramp portion (R). The ramp portion (R) may be a portion which is modulated by a compensation current applied to the substrate electrode 40, and may have a waveform which declines gradually over time while decreasing from the maximum of the DC pulse portion (P) to the minimum of the DC pulse portion (P).

A second bias power output having the nonsinusoidal voltage waveform may be applied to the substrate electrode 40, to generate relatively low ion energy on the surface of the substrate 100.

As illustrated in FIG. 9, the second etching process may be performed at a relatively low etch rate until the underlying buffer portion 123a of the object layer is removed completely, to form an object layer pattern 124. A portion of the object layer 120 on which the first etch stage has been performed may be further removed by the second etching process, to form a second opening 125 having a second depth D2 greater than the first depth D1 in the object layer 120. After performing the second etch process, the removal of the underlying buffer portion 123a of the object layer the thin layer 110 may be exposed.

In example embodiments, the substrate 100 on the electrostatic chuck 30 may be heated to a preset temperature. A power to the heater 32 may be adjusted using the heater power supply 70, to control the temperature of the electrostatic chuck 30.

During a third period of the second etching process, the electrostatic chuck 30 may be heated to a third preset temperature. During a fourth period of the second etching process, the temperature of the electrostatic chuck 30 may be increased from the third preset temperature to a fourth preset temperature. The substrate 100 may be processed at the third preset temperature during the third period of the second etching process and may be processed at the fourth preset temperature during the fourth period of the second etching process.

In here, the filter 72 installed between the heater 32 and the heater power supply 70 may pass an AC component of a sinusoidal waveform from the heater power supply 70 and block a pulse component from the bias power supply 41, to thereby protect the heater power supply 70.

As mentioned above, the first etching process using the relatively high ion energy may be performed until the underlying buffer portion 123a in the object layer remains, and the underlying buffer portion 123a of the object layer may be removed by the second etching process using the relatively lower ion energy.

Thus, in example embodiments, damage to the thin layer 110 under the object layer pattern 124 may be prevented, an etched angle θ between a bottom face and a sidewall face of the etched opening may be nearly 90 degrees, a lateral and vertical etch ratio (L/V) may be adjusted precisely to control a pattern CD. That is, the object layer pattern 124 may be formed to have a desired etch profile, without causing failures such as bowing or facet in the etched opening.

Further, a mixture ratio of hydrogen gas ($H_2$ gas) and nitrogen gas ($N_2$ gas) may be controlled to adjust the etch profile. As the percentage of hydrogen gas ($H_2$ gas) of the total mixture gas is increased, the etched angle θ may be increased toward 90 degrees.

A semiconductor device manufactured by a plasma processing apparatus and a plasma processing method in accordance with example embodiments may be used in various systems such as a computing system. The semiconductor device may include a finFET, a DRAM, a VAND, etc. The system may be applied to a computer, a portable computer, a laptop computer, a personal portable terminal, a tablet, a cell phone, a digital music player, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A plasma processing method, comprising:
applying a plasma generating power output to an upper electrode, to form plasma within a chamber;
applying a first bias power output having a sinusoidal voltage waveform to a substrate electrode within the chamber to perform a first etch stage on an object layer on a substrate within the chamber, to form a first opening in the object layer; and
applying a second bias power output having a nonsinusoidal voltage waveform to the substrate electrode to perform a second etch stage on the first opening in the object layer on the substrate, to form a second opening in the object layer until an underlying layer is exposed,
wherein the nonsinusoidal voltage waveform of the second bias power output comprises a periodic waveform having a DC pulse portion and a ramp portion,
wherein applying the first bias power output to the substrate electrode comprises generating ion energy of a first level on a surface of the substrate, and applying the second bias power output to the substrate electrode comprises generating ion energy of a second level less than the first level on the surface of the substrate,
wherein when the second bias power output is applied to the substrate electrode, an ion energy distribution having one peak value is generated on the surface of the semiconductor substrate,
performing the first and second etch stages comprises processing the substrate at a first preset temperature during a first period and processing the substrate at a second preset temperature during a second period respectively, and
wherein the second preset temperature is greater than the first preset temperature.

2. The method of claim 1, wherein the ramp portion has a waveform which declines gradually over time while decreasing from a maximum of the DC pulse portion to a minimum of the DC pulse portion.

3. The method of claim 1, wherein applying the second bias power output to the substrate electrode comprises applying a compensation current to the substrate electrode to modify the DC pulse portion of the nonsinusoidal voltage waveform.

4. The method of claim 1, further comprising
adjusting a power applied to a heater using a heater power supply to increase a temperature of an electrostatic chuck to a preset temperature, the electrostatic chuck supporting the substrate; and
blocking components of the first and second bias power outputs from being transferred to the heater power supply by using a filter installed between the heater and the heater power supply.

5. The method of claim 1, further comprising introducing process gases having a predetermined mixture ratio onto the substrate.

6. A method of manufacturing a semiconductor device, comprising:
applying a plasma generating power output to an upper electrode, to form plasma within a chamber;

applying a first bias power output having a sinusoidal voltage waveform to a substrate electrode within the chamber and etching an object layer on a semiconductor substrate within the chamber until an underlying buffer portion remains, to form a preliminary pattern in the object layer; and applying a second bias power output having a nonsinusoidal voltage waveform to the substrate electrode and etching the preliminary pattern in the object layer to remove the underlying buffer portion until an underlying layer is exposed and form an object layer pattern, wherein the nonsinusoidal voltage waveform of the second bias power output comprises a periodic waveform having a DC pulse portion and a ramp portion, wherein applying the first bias power output to the substrate electrode comprises generating first ion energy on a surface of the semiconductor substrate, and applying the second bias power output to the substrate electrode comprises generating second ion energy less than the first ion energy on the surface of the semiconductor substrate, wherein when the second bias power output is applied to the substrate electrode, an ion energy distribution having one peak value is generated on the surface of the semiconductor substrate, wherein etching the object layer is performed at a first preset temperature during a first period and etching the preliminary pattern in the object layer is performed at a second preset temperature during a second period, and wherein the second preset temperature is greater than the first preset temperature.

7. The method of claim 6, further comprising forming a photoresist pattern on the object layer, and wherein etching the object layer comprises using the photoresist pattern as an etching mask.

\* \* \* \* \*